(12) United States Patent
Hu et al.

(10) Patent No.: US 9,350,379 B1
(45) Date of Patent: May 24, 2016

(54) SYSTEM AND METHOD FOR DATA CONVERSION OF SIGNALS USING NOISE SHAPING

(71) Applicants: Lan Hu, Ottawa (CA); Sai Mohan Kilambi, Ottawa (CA)

(72) Inventors: Lan Hu, Ottawa (CA); Sai Mohan Kilambi, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/597,514

(22) Filed: Jan. 15, 2015

(51) Int. Cl.
*H03M 3/02* (2006.01)
*H03M 3/00* (2006.01)

(52) U.S. Cl.
CPC ............... *H03M 3/322* (2013.01); *H03M 3/30* (2013.01); *H03M 3/496* (2013.01); *H03M 3/50* (2013.01)

(58) Field of Classification Search
CPC ....... H03M 3/322; H03M 3/496; H03M 3/50; H03M 3/30
USPC ......................................... 341/143, 144, 155
See application file for complete search history.

(56) References Cited

U.S. PATENT DOCUMENTS

| 5,748,126 | A | * | 5/1998 | Ma | H03M 3/508 341/143 |
| 6,177,896 | B1 | * | 1/2001 | Min | H03M 3/504 341/143 |
| 6,292,124 | B1 | | 9/2001 | Hanada et al. | |
| 8,294,605 | B1 | * | 10/2012 | Pagnanelli | H03M 3/358 341/144 |
| 8,698,661 | B2 | * | 4/2014 | Kinyua | H03M 3/504 341/143 |
| 2004/0252038 | A1 | | 12/2004 | Robinson et al. | |
| 2008/0042886 | A1 | | 2/2008 | Li Puma | |

OTHER PUBLICATIONS

International Search Report for International Application No. PCT/CN2015/096465 mailed Feb. 15, 2016.

* cited by examiner

*Primary Examiner* — Brian Young (57) ABSTRACT

Apparatus and methods are taught for dividing a signal to be processed by a Noise Shaping (Hereafter NS) loop into smaller sections, and applying NS to at least a subset of these smaller sections. The processed signals are then recombined. As noise shaping is performed on smaller sections, the operating speed of each noise shaping loop, and accordingly for the system in general, is faster than if the output signal had been generated by single higher bit NS loop. Embodiments further include a configuration block for configuring the apparatus. For example, the number of sections, the section calculation method, and the NS for each section can each be configurable, and for some embodiments, programmable.

23 Claims, 11 Drawing Sheets

Figure 5 Cascaded Structure

SYSTEM AND METHOD FOR DATA CONVERSION OF SIGNALS USING NOISE SHAPING

TECHNICAL FIELD

This disclosure relates to data conversion technologies (for example Digital-to-Analog Converters (DAC) and Analog-to-Digital Converters (ADC) which utilize noise shaping, for example Sigma-Delta Modulation (also known as Delta-Sigma Modulation).

BACKGROUND

The term Sigma Delta Modulation, which is also called Delta Sigma Modulation, is often used to refer to systems which utilize a feedback loop to noise shape a signal. A Sigma Delta Modulator (at least in the example of an ADC) typically involves oversampling, quantization, noise shaping and decimation. Sigma Delta Modulation is often used as part of ADCs and DACs, as well as other applications, including audio and video processing, medical devices, optical and wireless communication systems, sensors, etc.

However, the processing requirements for such devices have increased as the bandwidth of signals to be processed have increased. There is a need for an architecture which reduces the hardware requirements for these devices, or, alternatively, allows processing of increased signal bandwidth without increasing the hardware requirements for such devices.

SUMMARY

Aspects of the invention provide a system and method used for high resolution data conversion of a signal which maintains the signal-to-noise ratio while reducing the resolution during signal processing.

An aspect of the invention involves dividing a signal to be processed by a noise shaping loop into smaller sections and applying noise shaping to at least a subset of these smaller sections. The processed signals are then recombined. As noise shaping is performed on smaller sections, the operating speed of each noise shaping loop and, accordingly for the system in general, is faster than if the output signal had been generated by a single higher bit noise shaping loop. As noise shaping is now performed on smaller sections, the system allows for increased operating speed and, accordingly, can accommodate increased input signal bandwidths.

A first aspect of the invention provides an apparatus for transforming an input signal comprising a section calculation block which divides the input signal into a plurality of section signals. The apparatus further comprises a section Noise Shaping (hereafter NS) block including at least one NS loop which applies at least one NS filter function to at least a subset of said plurality of section signals to produce corresponding noise shaped section signals. For some embodiments, the subset of sections which undergoes NS may be less than all of the sections, because there may be advantages to have one (or possibly more) sections by-pass the NS function. Such an apparatus further comprises a section reconstruction block which combines said corresponding noise shaped signals and any remaining of said plurality of section signals into an output signal.

Another aspect of the invention provides for such an apparatus which is configurable and further comprises a configuration block for configuring said apparatus depending on a configurable aspect. For example, such an apparatus may be configurable in that the number of sections, the section calculation method, section NS and section scaling factors can each be configurable and, for some embodiments, programmable.

Another aspect of the invention provides for a method for processing an input signal comprising: dividing said input signal into a plurality of section signals; applying at least one NS filter function to at least a subset of said plurality of section signals to produce said subset of noise shaped section signals; and combining said subset of noise shaped signals and any remaining of said plurality of section signals which were not subject to NS into an output signal.

The foregoing and other objects, features, aspects and advantages of the present invention will become more apparent from the following detailed description, taken in conjunction with the accompanying drawings which description is by way of example only.

DESCRIPTION OF EMBODIMENTS

A system for performing Sigma Delta Modulation (SDM), which is also called Delta Sigma Modulation, on an input signal involves using a single Sigma Delta Modulator, including a single NS filter, for the entire signal, SDM can be used for high resolution data conversion of a signal which maintains the signal-to-noise ratio while reducing the resolution during signal processing. It should be appreciated that SDM (at least in the example of an ADC) typically involves oversampling, quantization, noise shaping and decimation.

However, the term Sigma Delta Modulation is often used to refer to systems which utilize a feedback loop to noise shape a signal, even if the apparatus operates purely in the digital domain, where no "modulation" occurs. Further, some skilled in the art differentiate between an SDM and Noise Shaper. For example, see E. Janssen, A. van Roermund, *Look-Ahead Based Sigma-Delta Modulation, Analog Circuits and Signal*

*Processing*, DOI 10.1007/978-94-007-1387-1_2, © Springer Science+Business Media B.V. 2011, and in particular, Chapter 2, entitled *Basics of Sigma-Delta Modulation*. To avoid confusion, we will discuss exemplary embodiments within this specification in terms of a Noise Shaping (NS) loop, although it should be understood that the principles discussed herein can be extended to cover what many would refer to as Sigma Delta Modulation.

Figure 1:
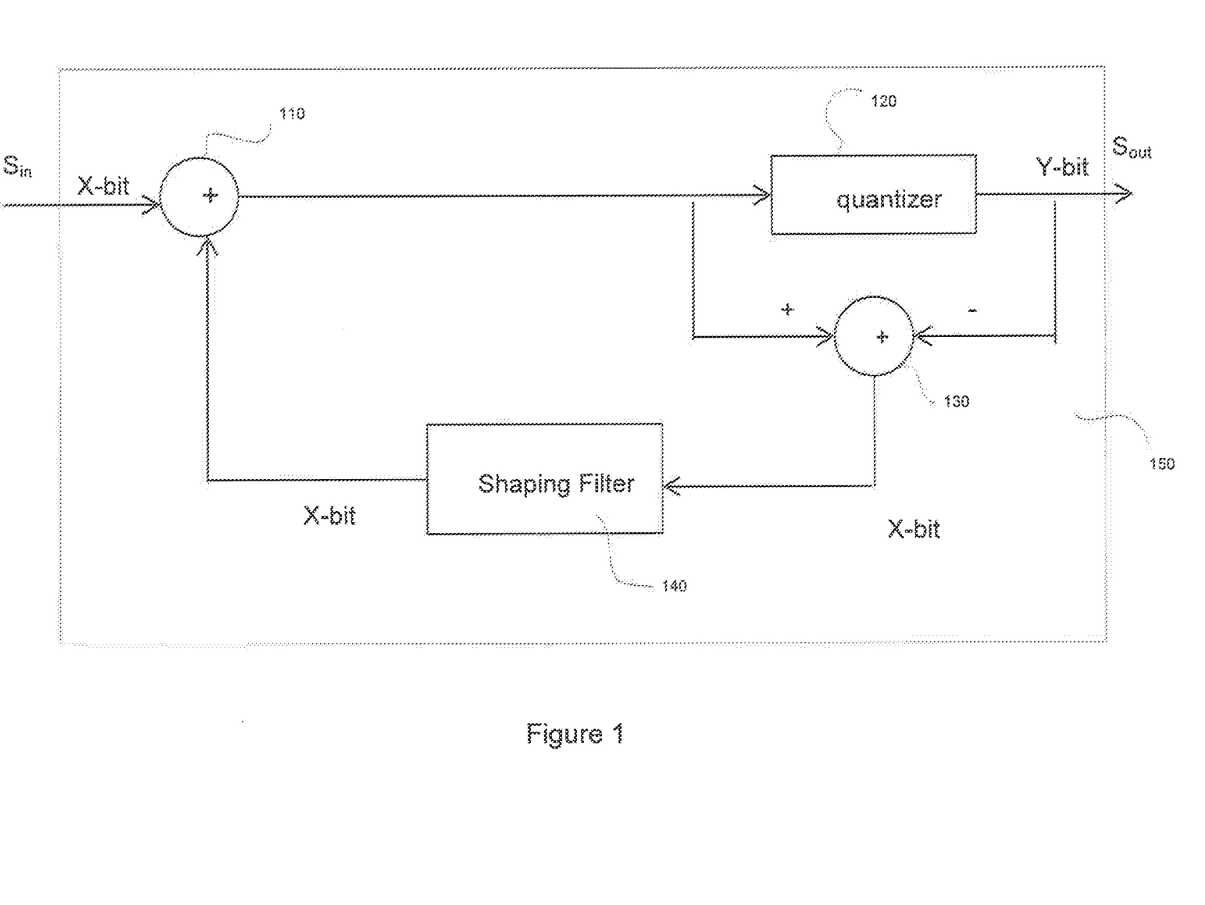
FIG. 1 is a block diagram illustrating a generic noise shaping feedback loop which can be utilized in embodiments.

FIG. 1 is a block diagram illustrating a generic NS loop 100. In this example, the noise shaping loop 100 converts an X-bit signal ($S_{in}$) into a Y-bit signal ($S_{out}$), with X>Y. The X-bit input signal is combined with the output of the shaping filter 140 by combiner 110 which is quantized by quantizer 120. Combiner 130 effectively subtracts the quantized signal front the input signal such that the shaping filter 140 shapes the quantization noise introduced by the quantizer away from the band of interest. In any event, it can be seen that the shaping filter 140 and the combiner 110 act on a signal of X bits.

Figure 2:
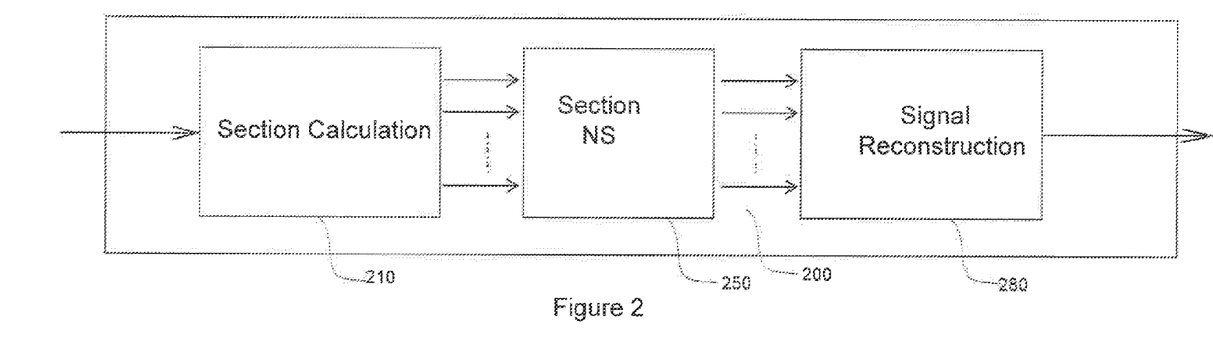
FIG. 2 is a block diagram illustrating schematically an embodiment.

A system for transforming an input signal, according to an embodiment of the invention, is illustrated in FIG. 2. FIG. 2 illustrates an apparatus comprising a section calculation block, a section NS block and a signal reconstruction block. Very briefly, an aspect of the invention involves dividing a signal to be processed by a NS loop into smaller sections, and applying NS on at least a subset of these smaller sections. The processed signals are then recombined to produce an output signal. As NS is now performed on smaller sections, such a system allows for increased operating speed. Embodiments can be configured to produce an output signal equivalent to the output signal if a single higher bit NS loop had been utilized (in the sense that the output can be used for the same application), but which will typically have a higher operating speed than if said single higher bit NS loop had been utilized. It should be appreciated that for many applications, an increased operating speed typically results in supporting a higher bandwidth input signal.

For example, embodiments can be configured such that the reduction in the number of bits which undergo NS can increase the operating speed, as simpler chipset logic within the NS filters can be used for smaller bandwidths, for example by reducing the size of adders and multipliers. In some embodiments, additions and multiplications can be implemented as binary shifts and adds, further increasing speed. Embodiments can be configured such that this faster NS processing more than compensates for the additional processing required to split the signal into sections and then recombine, providing a net gain. Accordingly such an approach can lead to faster or cheaper (or both) systems, or systems which can process higher bandwidth signals and/or with higher resolution.

Such an architecture allows for embodiments wherein different noise weighting algorithms and quantization may be applied to different parts of the signal. Further the quantization noise contributed by each section can be different, allowing for embodiments in which the system can be configured such that the total quantization noise introduced by the quantizer of each section is less than the quantization noise introduced had a single NS loop with a single quantizer had been utilized.

The exemplary embodiment illustrated in FIG. 2 comprises a section calculation block 100 which divides said input signal into a plurality of section signals. The plurality of section signals are passed to the section NS block 200 which applies NS to (at least a subset of) the plurality of section signals. Often each section signal will pass through a NS filter within the NS block. However, the section NS block need not necessarily apply an NS transformation to every section. In other words, in some embodiments one or more of said sections will not be processed by a NS loop, hereafter referred to as by-passing the NS. This allows for applications/signals in which one or more sections require a higher resolution, or are considered more important than other sections (for example because they include Most Significant Bits (MSBs)), and those sections may by-pass the NS. It should be appreciated that it is equivalent for such by-pass signals to by-pass the entire NS block. Accordingly the NS block includes at least one NS filter which applies at least one NS filter function to at least a subset of said plurality of section signals to produce corresponding noise shaped section signals. As one example, let us assume the signal is split into 4 sections. The first section includes MSBs, and by-passes NS (either by by-passing the entire block or, if passed to the block, by-passes the NS filter within the block). A subset (namely 3, in this example) of the sections undergoes NS within said NS block to produce 3 corresponding noise shaped section signals.

A section reconstruction block then combines said subset of noise shaped signals, and any remaining of said plurality of section signals (by-passed sections) into an output signal.

Figure 3:
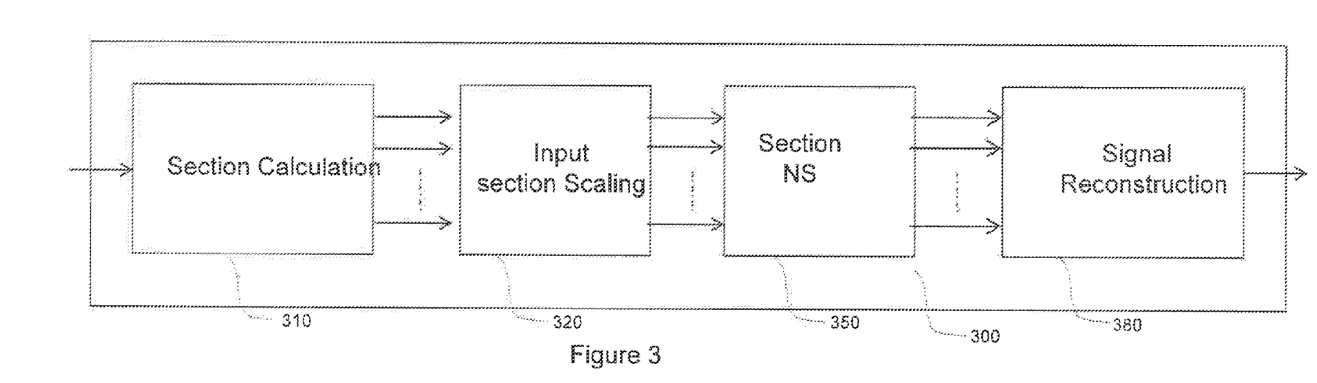
FIG. 3 is a block diagram illustrating schematically another embodiment which adds an input section scaling block to FIG. 1.

FIG. 3 is a block diagram illustrating schematically another embodiment which adds an input section scaling block to FIG. 2. Depending on the nature of the input signal, the application involved, and how the sections are calculated, a scaling function may need to be applied to one or more sections, either prior to or after NS. FIG. 3 illustrates an exemplary embodiment including an input section scaling block which applies a scaling factor to one or more of said plurality of section signals. However it should be appreciated that the scaling function can be applied either before the NS block, after, or both. Indeed, while shown as discrete blocks, it should be appreciated that scaling, NS and reconstruction functions can be combined and applied differently to appropriate section paths.

Figure 4:
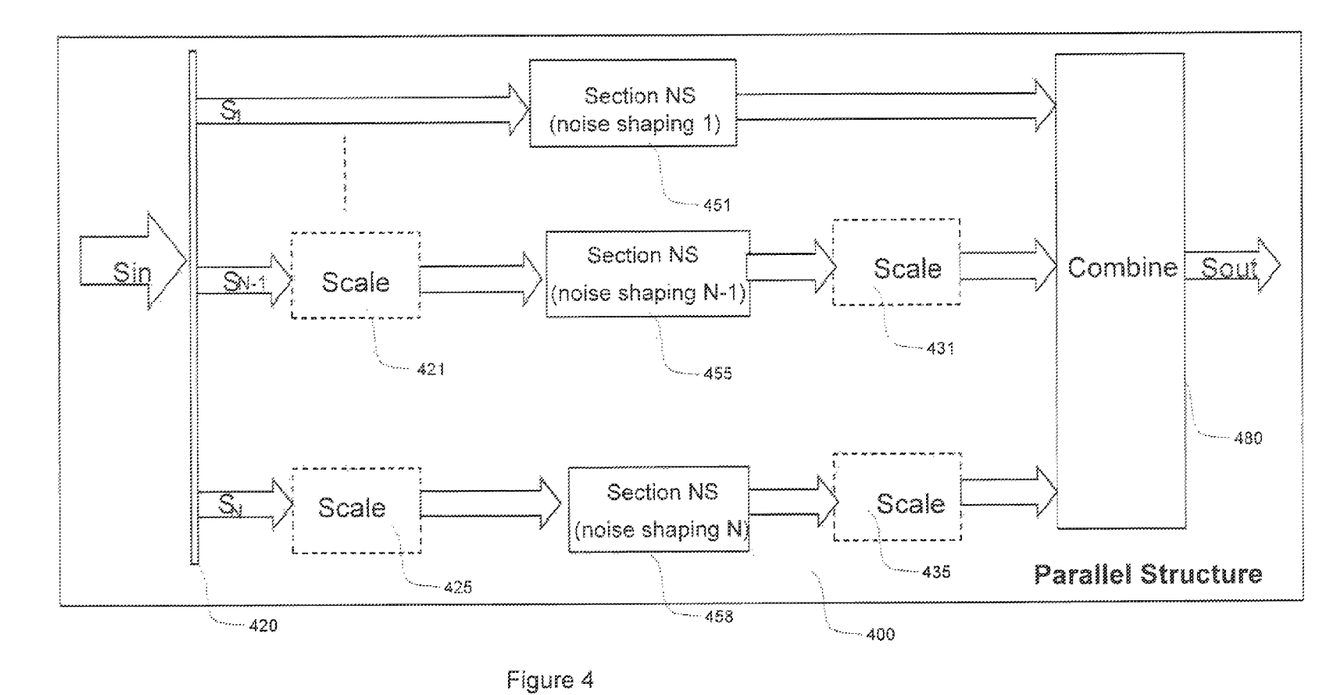
FIG. 4 is a block diagram illustrating schematically an embodiment having a parallel structure.

Aspects of the invention allow for a configurable apparatus which can be configured to have different functional structures. For example the sections can be processed in parallel, or in a cascading manner. FIG. 4 is a block diagram illustrating schematically an embodiment configured with a parallel structure.

In the embodiment illustrated in FIG. 4, the $S_{in}$ signal is split into N sections $S_1 \ldots, S_{N-1}$ and $S_N$ by section calculation bock 420. The apparatus 400 has a parallel structure such that said plurality of section signals are processed in parallel. The apparatus includes a section NS loop for each of the plurality of section signals and wherein each of said section NS loops includes a NS filter. Each of the plurality of NS filters are configurable with a different Noise-Weighting Function (hereafter "NWF") such that a different NWF can be applied to each section signal. Accordingly, the first section is processed by noise shaper 451, section $S_{N-1}$ is processed by noise shaper 455 and $S_N$ is processed by noise shaper 458. It should be noted that in some embodiments, the noise shaper 451 can be omitted, for example if $S_1$ includes MSBs.

Depending on the nature of the signal, and the application involved, apparatus 400 may include scale blocks 421, 425, 431 and 435, for applying a scaling function to the section signals. This will depend on the type of signal and sectioning applied. Examples of scaling will be discussed below, but in general it is needed if the section calculation method involves splitting the signal based on amplitude, and is not needed if the section calculation method is involves splitting the signal into bit-width sections.

Figure 5:
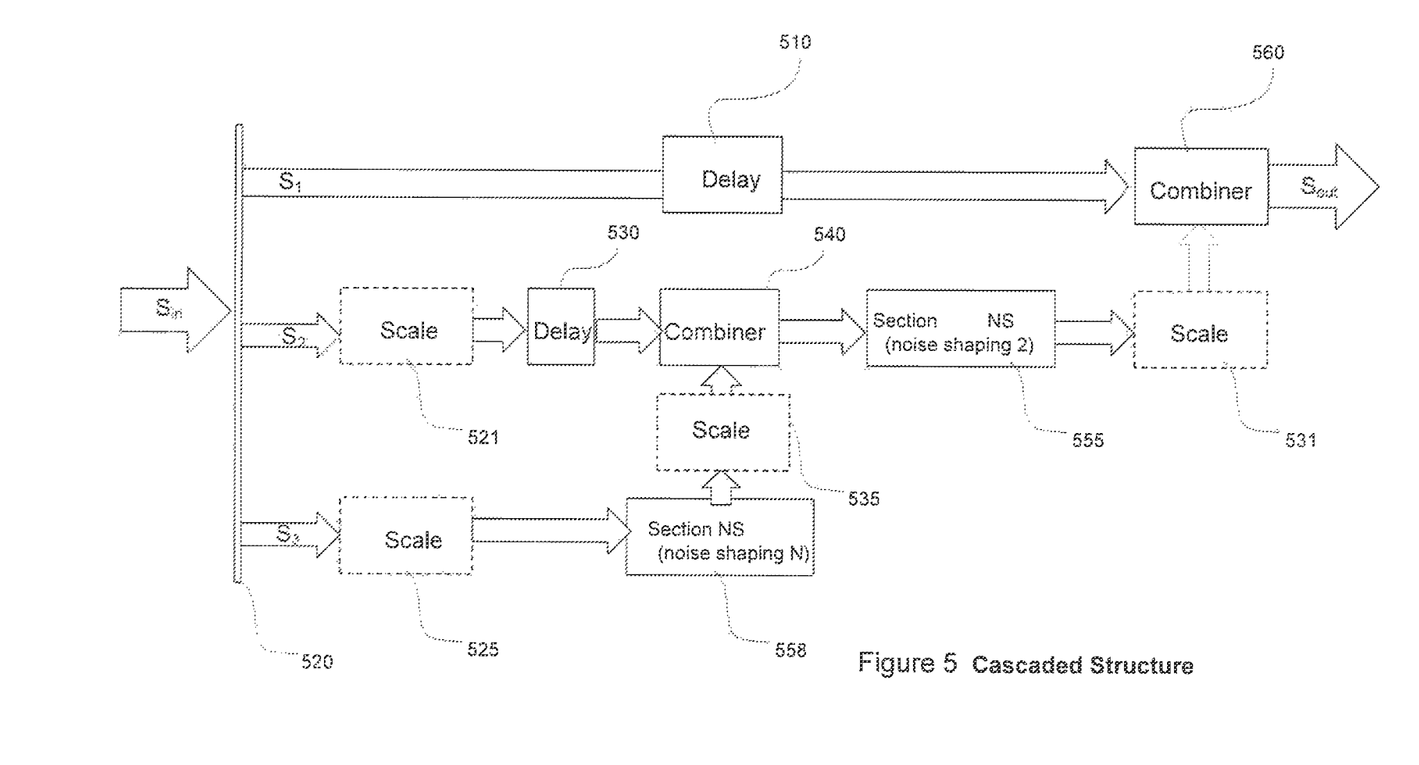
FIG. 5 is a block diagram illustrating schematically an embodiment having a cascading structure.

FIG. 5 is a block diagram illustrating schematically an embodiment having a cascading structure. in this embodiment, the distinctions between the NS and reconstruction blocks are blurred, as those functions are implemented in a cascading structure. In other words, the embodiment illustrated in FIG. 5 is configured to have a cascading structure such that said section NS block and said section reconstruction block are combined into a series of cascading signal paths which includes a series of cascading section NS loops, combiners and delays elements.

In the embodiment illustrated in FIG. 5, the $S_{in}$ signal is split into 3 sections $S_1$, S2, and $S_3$ by section calculation bock 520. The apparatus 500 has a cascading structure such that said the third section is processed by NS filter loop 558 and then combined via combiner 540 with a delayed section 2, the combination of which is processed by noise shaper 555 before being combined with a delayed section 1. Delay element 530, which can be a simple delay line, is included to keep the noise shaped section 3 in sync with section 2. Similarly, delay element 510 is included to compensate for any processing delays introduced by the processing of sections 3 and 2. As illustrated, S1 does not undergo NS, but it should be recognized that a NS loop could be added after combiner 560 if needed. Accordingly the apparatus can include a section NS loop for each of the plurality of section signals. In any event, each of said section NS loops includes a NS filter. Each of the plurality of NS filters are configurable with a different NWF such that a different NWF can be applied to each section signal.

Depending on the nature of the signal, and the application involved, apparatus 500 may include scale blocks 521, 525, 531 and 535, for applying a scaling function to the section signals. This will depend on the type of signal and sectioning applied. It should be appreciated that while this example only illustrates 3 sections, additional sections can be accommodated.

We will now discuss section calculation. In an embodiment the section calculation block comprises an amplitude splitter which splits the incoming signal into said plurality of section signals based on signal value (i.e. amplitude). For example, the input signal dynamic range is divided into several sections. In this case, for N sections:

$$S_{in}=S_{out1}+S_{out2}+\ldots+S_{outN} \quad \text{(Equation 1)}$$

Another embodiment divides the signal into sections based on bit-width. Accordingly the section calculation block comprises a bit-width splitter which splits said incoming signal into several lower bit sections, with the sum of bit-widths of the sections equaling the bit-width of said input signal. In implementation the segmentation is slightly different depending on whether the input signal represents a fractional value or an integer:

$$S_{in}=S_{out1}+2^{-shift1}S_{out2}+2^{-shiftN\_1}S_{outN}(S_{in} \text{ is fractional value}) \quad \text{(Equation 2)}$$

$$S_{in}=2^{shiftN\_1}S_{out1}+2^{shiftN\_2}S_{out2}+\ldots+S_{outN}(S_{in} \text{ is Integer}) \quad \text{(Equation 3)}$$

Either of these two methods can be used for both the cascaded and parallel structure described above. The section calculation method chosen depends on the input signal and/or the nature of the application. For example, if the input signal or nature of the application requires sign data format, section calculation based on amplitude is preferred. For embodiments in which section calculation is based on the signal amplitude, section scaling can be used to reduce the number of bits which need to undergo noise shaping. For example, the 'scale' blocks shown in dotted lines in FIG. 4 for the parallel structure and in FIG. 5 for the cascaded structure are preferably used for section calculations based on amplitude. For unsigned signals, sectioning based on signal value or bit-width can be used without any additional scaling.

Figure 6:
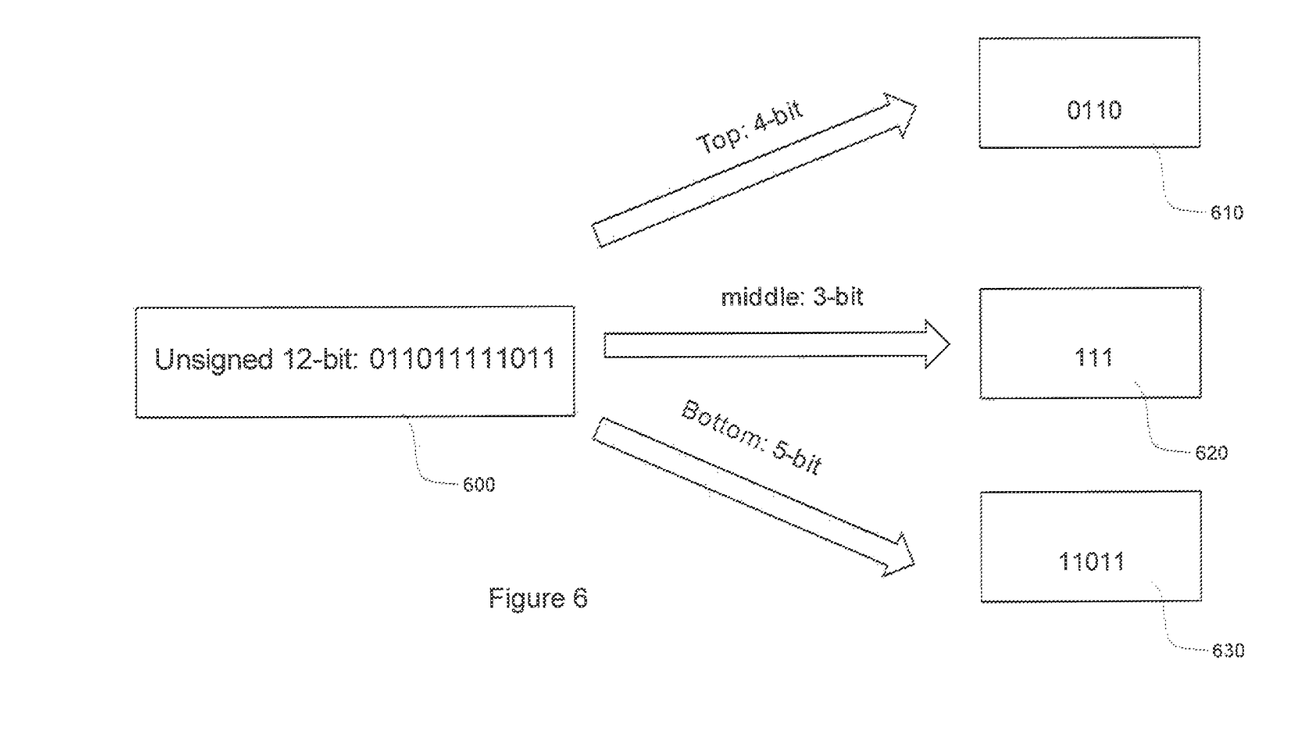
FIG. 6 illustrates one method of dividing an unsigned input signal into sections according to an embodiment.

FIG. 6 illustrates one method of dividing an unsigned input signal into sections according to an embodiment. In this example, as the input signal is unsigned, the section calculation block can divide the signal into sections based on bit-width. One specific example is shown for a 12-bit portion of an unsigned signal 600. In this example the 12-bits of the input signal are 011011111011 and the system is configured to divide the signal into 3 sections. Note that, as shown, the section widths need not be equal. The section calculation block divides this 12-bit input based on bit-width so that top section 610 includes the top 4 bits (that is to say the first 4 bits, namely 0110), the middle section 620 includes the middle 3 bits (111) and the bottom section 630 includes the bottom 5 bits (11011).

Sectioning by bit-width can be thought of as a form of reverse concatenation, in the sense that the three sections can be concatenated together to form the original input signal. It should be noted that there are many ways of dividing the signal into sections. For example, the 12-bit input signal in FIG. 6 could have been split into three 4-bit sections, or four 3-bit sections. The section calculation can take into account the needs of the application and the nature of the input signal. For example, if there are many leading or trailing zeroes in the incoming signal, then the sectioning method can divide the signal into sections with MSBs and sections with less significant bits. For example a 15-bit signal with trailing zeroes can be divided into two sections, with the top section being a 5-bit section of non-zeroes, while the bottom section is a 10-bit section of zeroes. If there are both leading and trailing zeros, one possible section calculation would produce a top section with the top 5-bit zeroes, a middle section with the middle 5-bit non-zeroes, and the bottom section with the bottom 5-bit zeroes. Similarly a 15-bit signal with many leading zeroes can be divided into two sections with the top section including the top 10-bit zeroes, and the bottom section including the bottom 5-bit non-zeroes.

Figure 7:
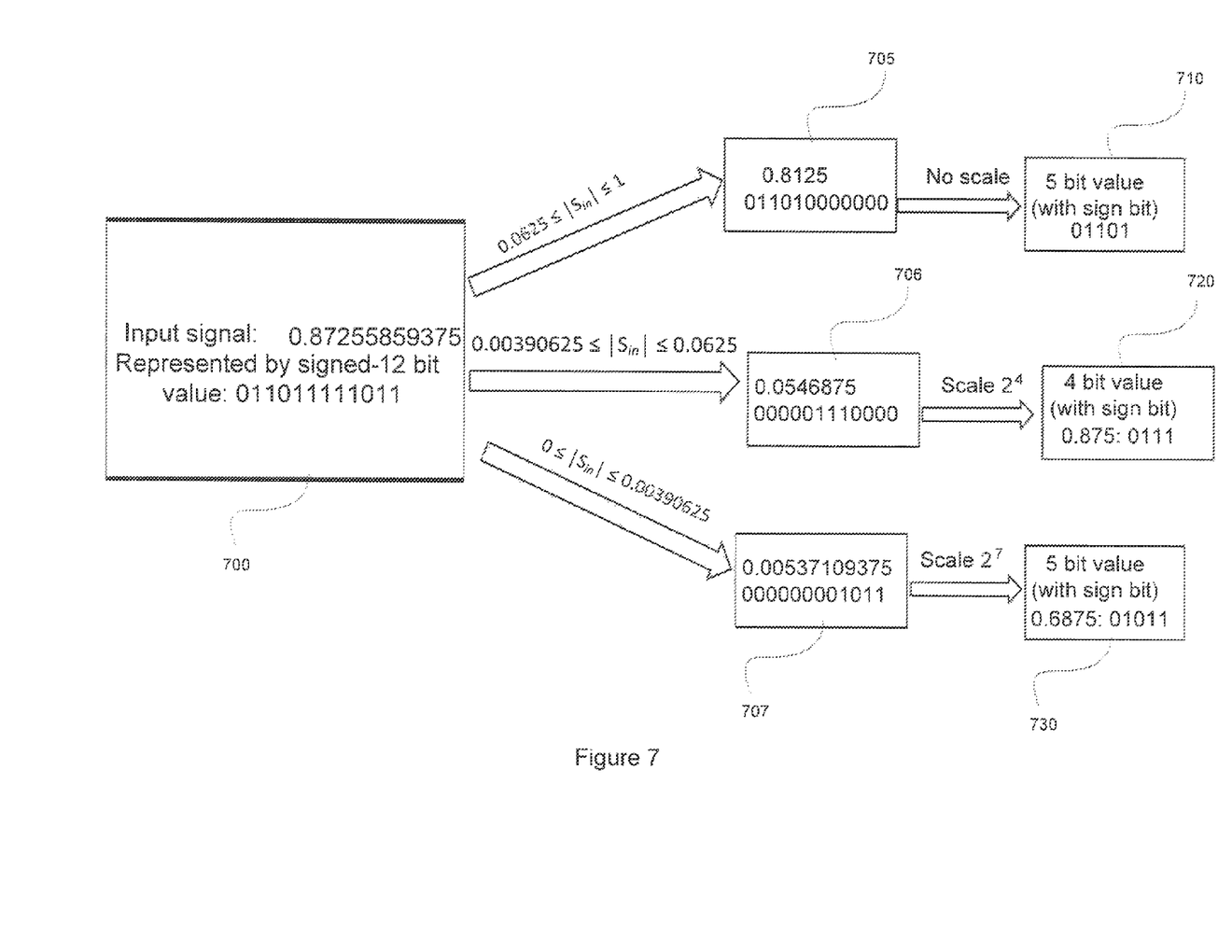
FIG. 7 illustrates one method of dividing a positive signed input signal into sections according to an embodiment.

FIG. 7 illustrates one method of dividing a positive-signed input signal into sections according to an embodiment. In this example, the positive signal is a fraction signal in two's complement format, but it should be appreciated that a similar approach can be used for integer signals as well. For this example, an input signal value of 0.87255859375 is chosen as this is represented by a signed 12-bit value of 011011111011, which is the same value as the input signal of FIG. 6, in order to compare and contrast the two approaches. In this example, the input signal 700 is split into 3 sections. The absolute value of the input signal is divided into three portions: the top section represents the portion $0.0625 \le |S_{in}| \le 1$; the middle section represents the portion $0.00390625 \le |S_{in}| \le 0.0625$; and the bottom section represents the portion $0 \le |S_{in}| \le 0.00390625$. The figure illustrates the resulting section values, and their corresponding binary representations in top block 705, middle block 706 and bottom block 707. It should be appreciated that the sum of the values 0.8125+0.0546875+0.00537109375 equals the input signal value of 0.87255859375. No scaling factor is applied to the top section to produce the 5-bit (including sign bit) section 710. A scaling factor of $2^4$ is applied to the middle value 706 to remove the first 4 leading zero bits (and the trailing zero bits) to produce the 4-bit (including sign bit) middle section 720. A scaling factor of $2^7$ is applied to the bottom value 707 to remove the first 7 leading zero bits to produce the 5-bit (including sign bit) bottom section 730. It should be understood the number of bits per section and the values used to determine the intermediate blocks 705, 706 and 707, as with the number of sections are configurable depending on the input signal, and application. It should be appreciated that this is just an example. The thresholds for splitting the signal can change for different applications depending on the number of sections to be used, or the number of bits to be maintained in each section.

Figure 8:
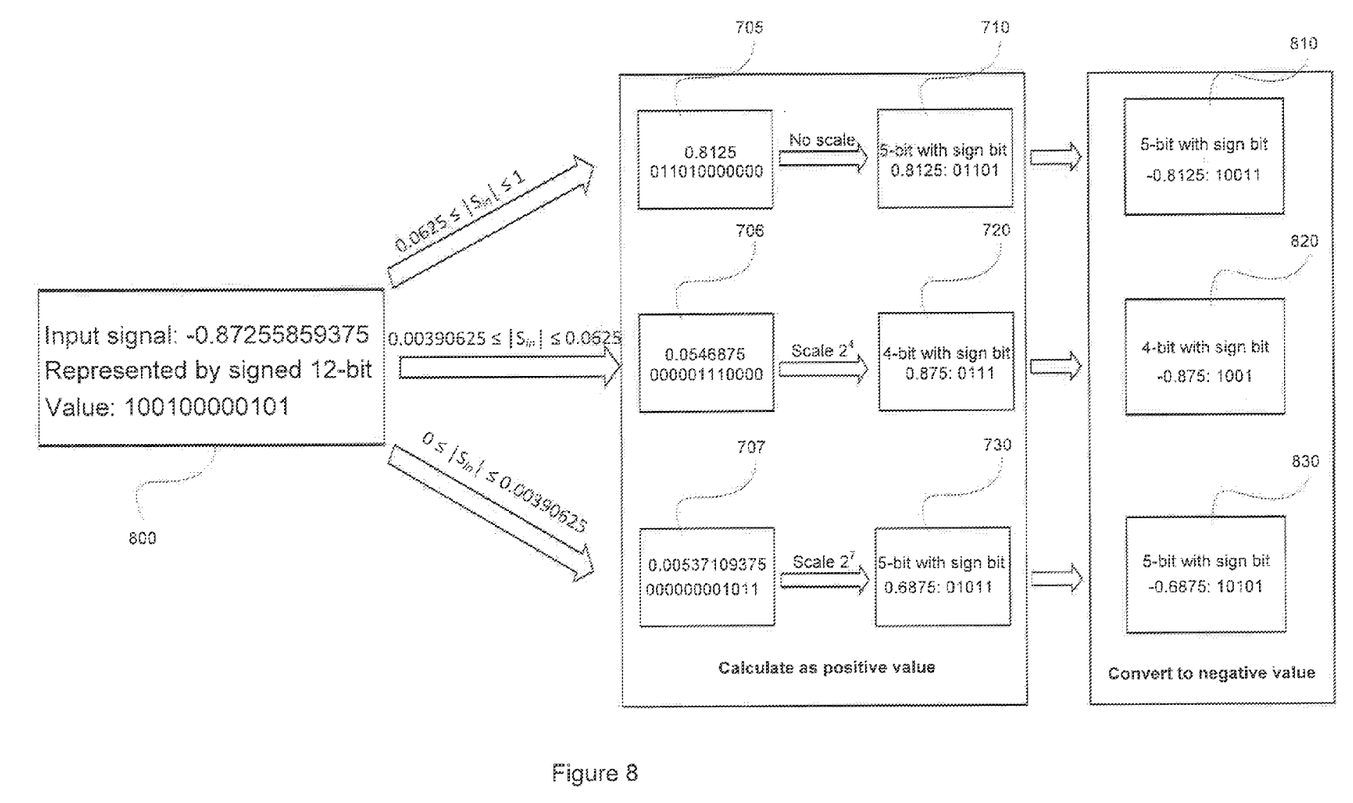
FIG. 8 illustrates one method of dividing a negative signed input signal into sections according to an embodiment.

FIG. 8 illustrates one method of dividing a negative-signed input signal into sections according to an embodiment. This example utilizes the negative value of the input signal of FIG. 7, namely: −0.87255859375 (again in two's complement format). It should be appreciated that this results in a different signed 12-bit input signal 800 than that of FIG. 7. However, as can be seen, in this embodiment, the sections are first calculated as positive values based on the absolute value of the input signal. Accordingly the procedure is followed as that shown in FIG. 7, and then an additional conversion step takes place to convert the top section 710, middle section 720 and bottom section 730 into negative values, resulting in the top section 810, middle section 820 and bottom section 830.

FIGS. 9A through 9D are block diagrams illustrating schematically 4 different structures, according to 4 different embodiments.

Figures 9A, 9B, 9C:
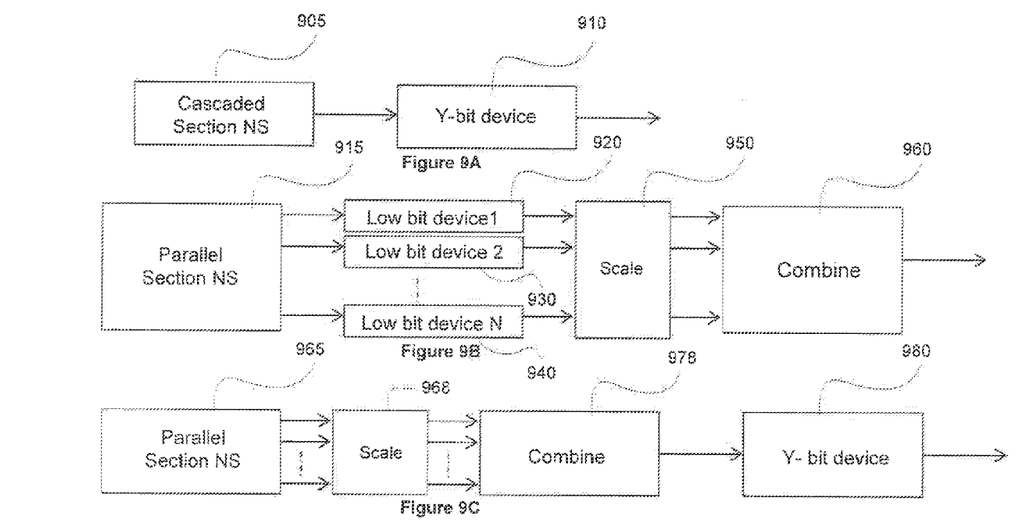
FIGS. 9A through 9D are block diagrams illustrating schematically 4 different structures according to 4 different embodiments.
Figure 9D:
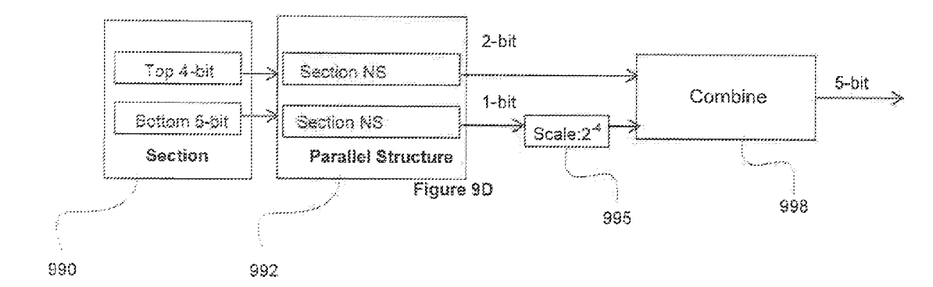

For each of FIGS. 9A-9C, the apparatus reduces an X-bit input signal into a Y-bit output signal. The Y-bit signal is then typically operated on by said Y-bit application device. A prior art system would have included a NS loop that operated on all X-bits to produce said Y-bit signal. As stated above, embodiments increase the operating speed by splitting the X-bit signal into N sections, and using NS loops which each operate on a smaller bit number, and then combine the noise shaped sections to produce a Y-bit output signal. The cumulative savings achieved by using the smaller NS loops exceeds the additional processing requirements of splitting the signal into sections and then recombining (and scaling, if needed). One additional advantage that may be achieved for some applications is to further reduce hardware processing by reducing the processing requirements needed by the Y-bit application device. This can be done, for some structures, by utilizing low-bit application devices which operate on the individual sections but which, after scaling and combining, produce a comparable output as would have been produced by the Y-bit application device. For some applications, this can be advantageous as such a structure can require less hardware processing in the aggregate than would be needed by a structure utilizing the Y-bit application device.

In this example, a system with a cascading NS structure 905, for example, that of FIG. 5, would directly feed a Y-bit device 910, according to the embodiment illustrated in FIG. 9A. However, FIGS. 9B and 9C illustrate two possible examples of parallel structure. For example, in FIG. 9C parallel section noise shaping block 965 would send N noise shaped sections to scale block 968 (if needed), which would scale sections split by amplitude prior to combining in block 978 to produce a Y-bit output signal to drive Y-bit device 980. An alternative structure can be used, for some applications as shown in FIG. 9B. In this case, rather than have the NS sections combined and fed to a Y-bit application device, each section is first processed by a low-bit application device (e.g., DAC, connector or other). For example, section 1 would be processed by low-bit device 1, section 2 would be processed by low-bit device 2, etc. ending with low-bit device N processing section N, as illustrated in blocks 920, 930 and 940. Each of these low-bit devices would operate on a smaller number of bits, and utilize fewer resources than an application device that needs to operate on the full Y-bits. The processed sections are then scaled (if needed) by scaler 950 and combined 960, at which point the output signal is equivalent to the output of Y-bit device 980.

What is more, when scaling is required, the low-bit devices can save resources by operating on fewer bits prior to combining compared to a Y-bit device operating on the combined signal, because additional bits are added by the scaling block. This is illustrated schematically in FIG. 9D. For ease of illustration, FIG. 9D only shows two sections. Accordingly, in this example, a section calculation block 990 splits the X bit signal (assumed to be 9 bits in this example) into two sections (a top 4-bit section, and a bottom 5-bit section). A section NS block 992, having a parallel structure, produces noise shaped sections at 2-bits and 1-bit respectively. If the Low bit devices can be used prior to combining than they can operate on 3 bits (the 2-bit and 1-bit sections, respectively). However, a Y-bit device operating after the combiner block 998 would operate on 5-bits. The additional 2-bits results from the scale factor applied by scale block 995 prior to signal reconstruction. Accordingly a structure which allows for low-bit devices to operate on the noise shaped sections prior to the combiner can save hardware resources compared to a system which utilizes a Y-bit application device after signal reconstruction. Further the use of such low-bit devices can relax the resolution requirements for the NS loop, as the NS loop will not need to produce an output which is 2-bits less in order to compensate for the additional 2 bits which would be added during scaling (compared to a similar system that does not use such low-bit devices).

Generalizing, some embodiments utilize N low-bit application devices (each operating on $A_1, A_2, \ldots A_N$ bits respectively) located between the NS block and the section reconstruction block such that said reconstructed output signal can be used as if it is a Y-bit signal produced by a Y-bit application device but for which $A_1+A_2+ \ldots +A_N<Y$.

Figure 10:
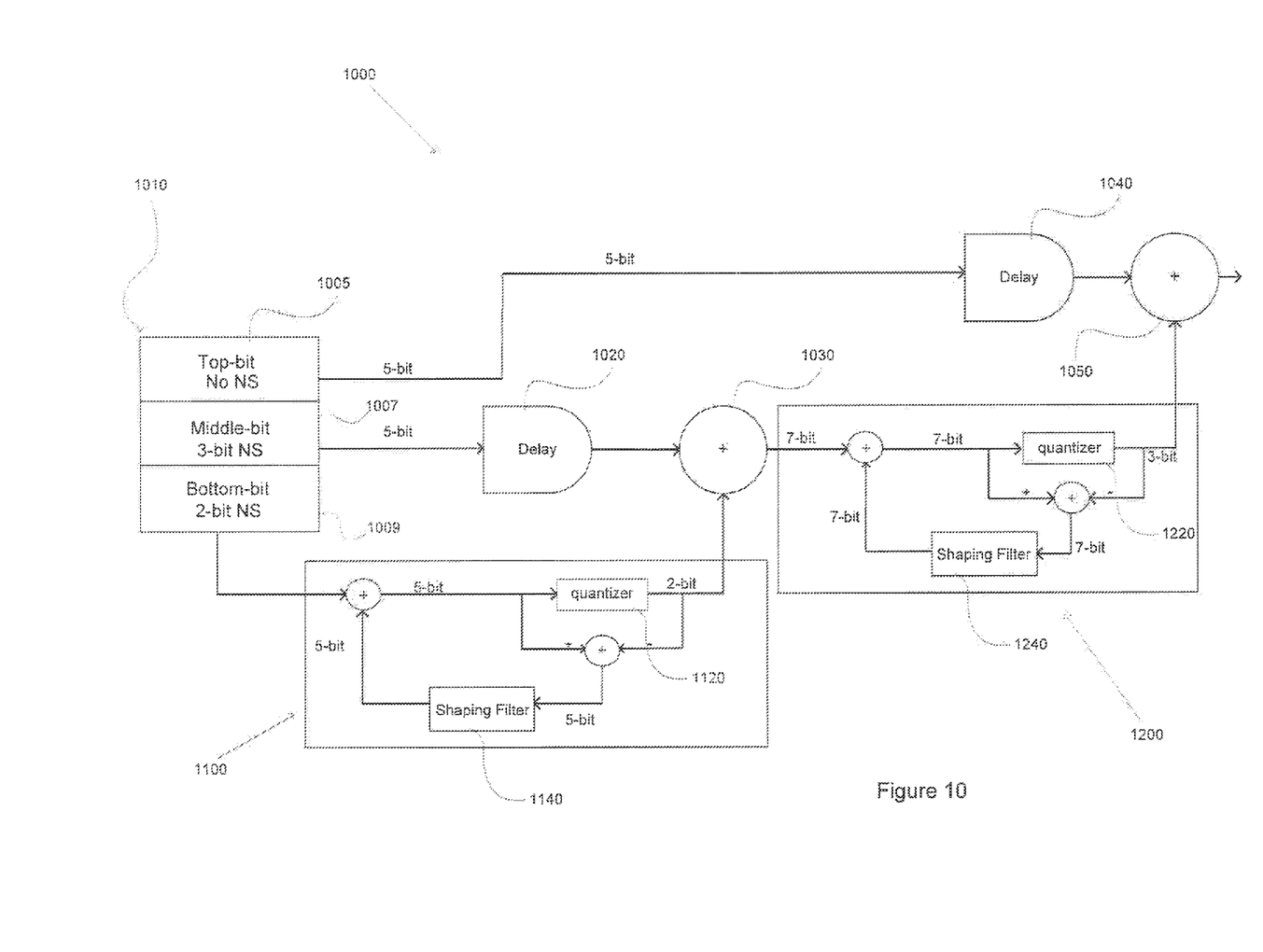
FIG. 10 is a block diagram illustrating schematically another embodiment having a cascading structure.

FIG. 10 is a block diagram illustrating schematically another embodiment having a cascading structure. FIG. 10 illustrates a particular example, for a 15-bit input signal producing an 8-bit output signal. Apparatus 1000 includes a section calculation block 1010 for splitting the signal into three sections, a bottom section NS loop 1100, a middle section loop 1200, and a top section path which does not utilize an NS loop. In this example, section calculation block 1010 divides the signal into three sections of equal bit-width, namely 5-bits each. The top section 1005 is not subject to NS, the middle section 1007, although being 5-bits wide, will be subject to a 3-bit NS (i.e. the output of the NS 1200 will be 3-bits wide) and the bottom section 1009, although being 5-bits wide, will be subject to a 2-bit NS (i.e., the output of the NS 1100 will be 2-bits wide).

The bottom NS loop 1100 includes quantizer 1120 which reduces the 5 bit section to a 2-bit output. However, noise shaping filter 1140 still operates at 5 bits, but this is still greatly reduced from the 15-bit input signal.

Meanwhile, the middle section, after passing through delay element 1020, is combined with the output from NS loop 1000 by combiner 1030, to produce a (5+2=) 7-bit input to NS loop 1200. NS loop 1200 includes quantizer 1220 which reduces the 7-bit signal to produce a 3-bit output signal, which is noise shaped by NS filter 1240. The 3-bit output is then combined with the 5-bit top section, which was delayed by delay element 1040, to produce the 8-bit output signal.

Referring briefly to FIG. 1, in order for a conventional system to convert a 15-bit input signal into an 6-bit output signal, the noise shaping filter 140, combiners 110 and 130 and quantizer 120 would all need to operate on 15-bit signals. Advantageously, in this example, the hardware requirements for device 1000 are comparatively reduced, as it should be appreciated that even though there are now two NS loops, the combined hardware resources that would be required to run device 1000, including both NS loop 1100 and NS loop 1200, are less than those required to operate a single loop operating at the full 15-bits.

Figure 11:
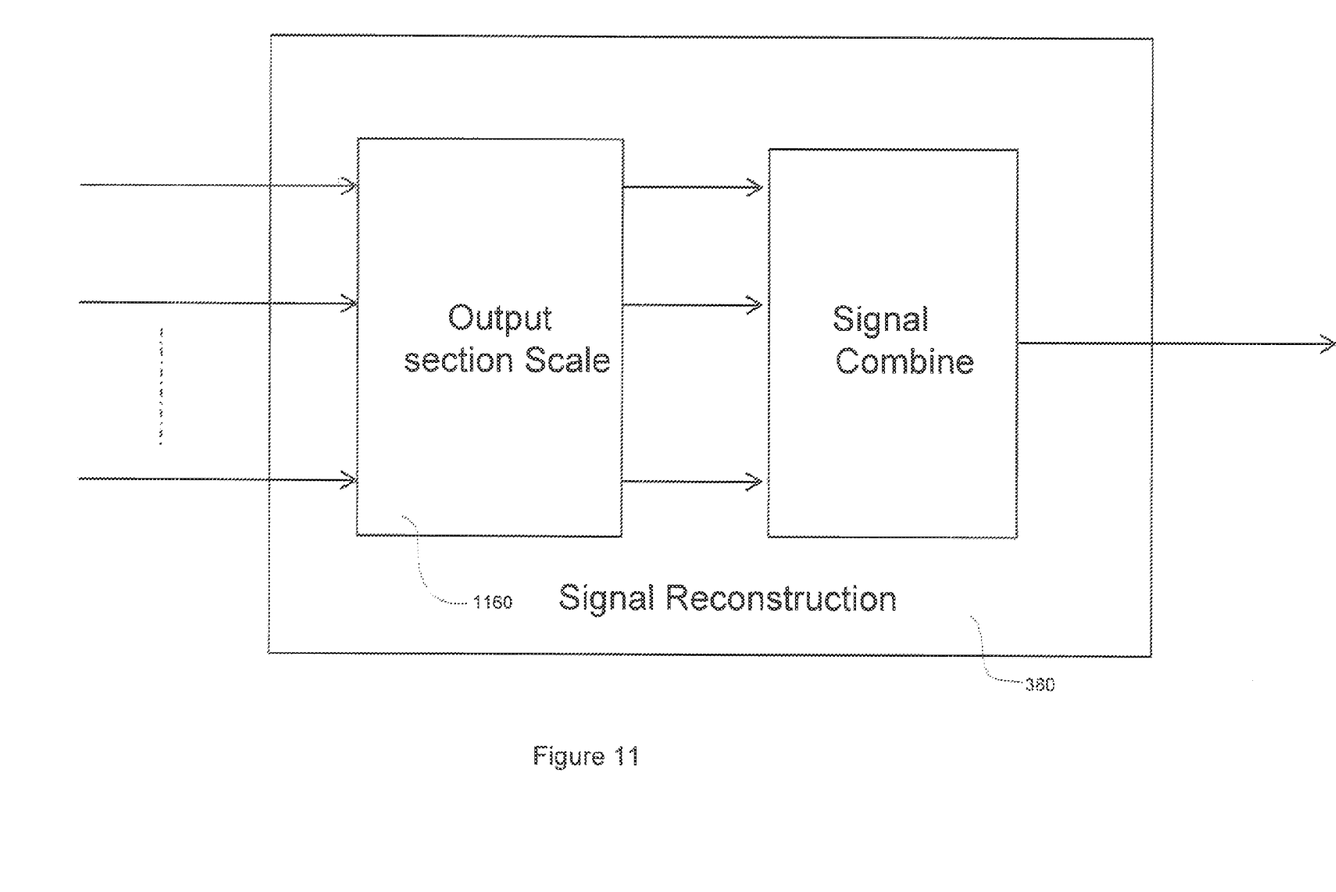
FIG. 11 is a block diagram illustrating schematically an exemplary signal reconstruction block which utilizes an output section scaling block according to an embodiment.

FIG. 11 is a block diagram illustrating schematically an exemplary signal reconstruction block which utilizes an output section scaling block, according to an embodiment. This figure shows more details of signal reconstruction block 380 of FIG. 3, illustrating that if input section scaling (i.e. after sectioning) is utilized, then a corresponding offsetting output scale factor 1160 is typically applied as part of the signal reconstruction. Further exemplary details are illustrated in FIGS. 4 and 5, as described above.

It should be noted that while we have discussed the figures above as separate embodiments, each apparatus need not be manufactured separately. A single configurable apparatus can be built which can be configured in these and other ways. Indeed, embodiments can be incorporated into a single FPGA, ASIC, CMOS, DSP or other chip. Other embodiments can be implemented using a general purpose processor and suitable machine readable media storing machine-readable code for executing routines for causing said processor to implement the functionality described herein. Some embodiments will initially be configured with appropriate sectioning, NS and scaling for a specific signal type and/or application. However, it is envisioned that the apparatus (whether it be implemented in one or more chips) can be re-configurable to be able to process a variety of signal types for a variety of applications.

Figure 12:
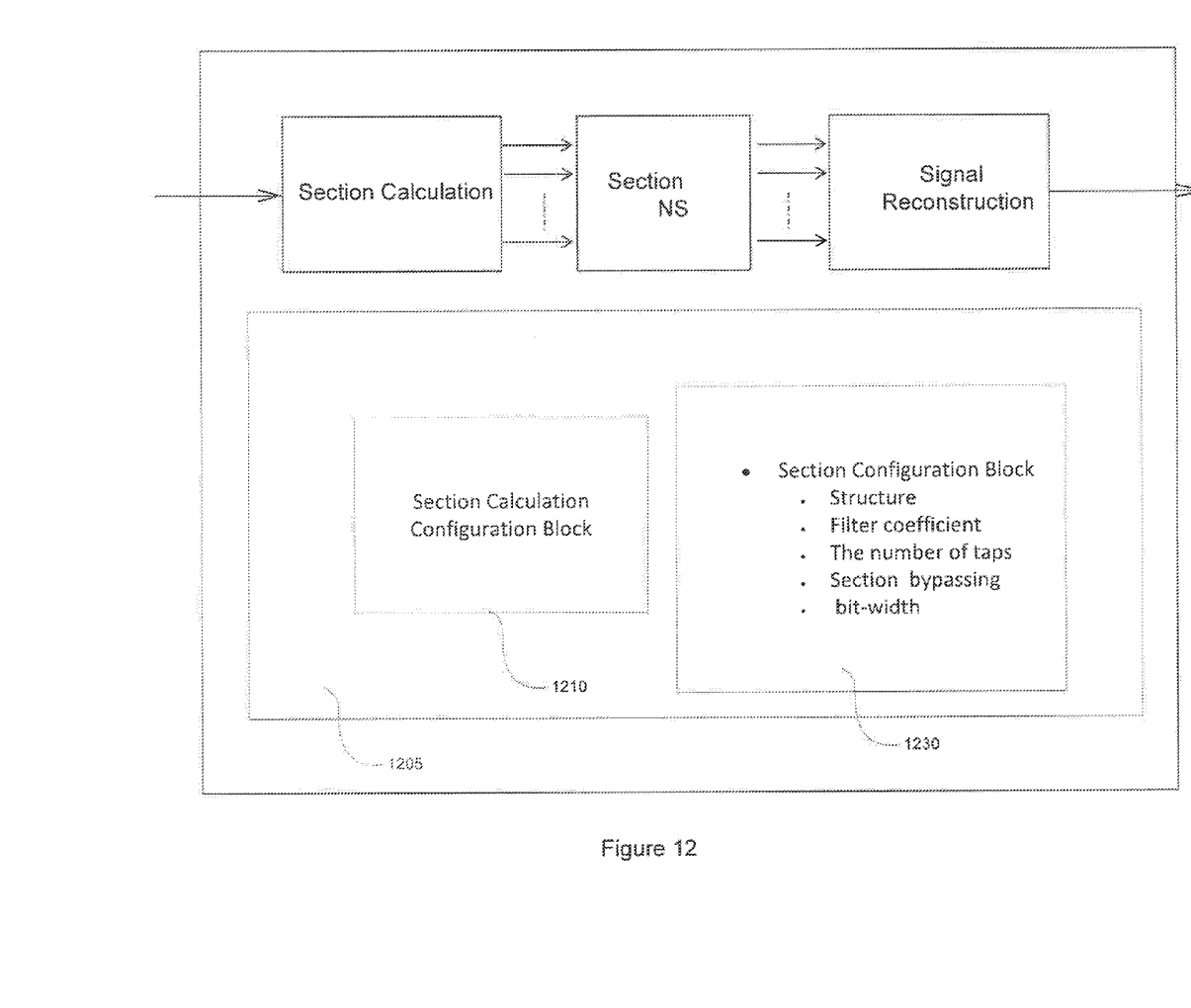
FIG. 12 is a block diagram illustrating schematically an exemplary configurable apparatus according to an embodiment.

Accordingly, FIG. 12 is a block diagram illustrating schematically an exemplary configurable apparatus, according to an embodiment. Such a system is highly configurable in that the number of sections, the section calculation method, section NS and section scaling a factors can be programmable.

Accordingly, FIG. 12 illustrates an embodiment which includes a configuration block 1205 for configuring the apparatus. For some embodiments the apparatus is programmable, in that it includes an interface for receiving input such that the device can be configured and optionally re-configured depending on the expected signal and application for which it is to be used, reducing manufacturing and inventory costs.

Configuration block 1205 includes a section calculation configuration block 1210 for configuring the section calculation block and a section configuration block 1230, for configuring the structure of the apparatus, including how the section NS block and Signal Reconstruction blocks are structured, whether any scaling is needed, as well as configuring the NS block itself, and the parameters for noise shaping.

The section calculation configuration block 1210 configures the apparatus to utilize an appropriate section calculation method depending on the input signal and/or the nature of the application. For example, if the input signal or nature of the application requires sign data format, section calculation based on amplitude is preferred. For unsigned signals, sectioning based on signal value or bit-width can be used without any additional conversion.

As will be appreciated, the section calculation configuration block 1210 and the Section configuration block 1230 are shown as separate blocks for illustration purposes. They can be combined and, if not combined, will typically include communication paths as the choice of section calculation can affect how the rest of the device should be configured.

For example each of the following configurations enabled by configuration block 1230 can depend on the section calculation method chosen by section calculation configuration block 1210:

configuration block 1230 configures combiners as bit concatenators for signal formats which are sectioned by bit-width and as adders for signal formats which are sectioned by amplitude;

configuration block 1230 configures the apparatus to have one of said sections, which include more significant bits than other sections, or for which it is desirable to avoid adding any distortion, to bypass a NS filter section;

configuration block 1230 configures the apparatus to apply a scaling factor to one or more of said plurality of section signals.

The section configuration block 1230 can configure the section NS loops, for example, based on the input signal's characteristics, signal bandwidth, and sampling rate. As already stated, embodiments can configure each NS filter with a different noise weighting function. Selection of the filter coefficient and the number of taps for each NS filter depends on such criteria as the input signal bandwidth, the performance requirement and sampling frequency. Generally speaking, the wider the section, the more coefficients and taps are used. As should be appreciated, an MP3 player or narrow-band wireless signal would likely require a smaller number of coefficients and taps than a broadband signal.

For example, for sections which need to maintain the original transition characteristics, the configuration block can configure the NS loops to utilize a high bit-width noise shaping filter with high stop band rejection. For sections that can tolerate higher in-band noise, a lower stop band rejection filter can be configured. For sections where the signal occupies a wider band, the NS filter can be configured with wider rejection bandwidth.

As another example, for a signal with a bottom section which has a wider bandwidth, the apparatus can be configured as follows in order to maintain the original signal's characteristics: wider rejection bandwidth NS filter can be used for the bottom section, whereas a narrow rejection bandwidth NS filter can be used for the top and middle sections.

The configuration block 1230 can also configure the resolution bit-width for each NS block depending on the performance requirement, signal bandwidth and NS filter chosen. In general, higher performance and larger bandwidth normally requires a larger bit-width.

The configuration block can configure the apparatus to have either a parallel or cascading structure. Each structure has advantages and disadvantages which can be considered when determining how to configure the apparatus. In particular, the apparatus can be configured based on the following criteria:

A parallel structure tends to have the advantages that it only requires a single reconstruction block, and is a simpler structure, which can tend to lower hardware costs, and it tends to have lower latency. Further it provides flexibility to allow for a multi-branch output, which can allow multiple low-bit application devices to be utilized before the combine block as described above with reference to FIG. 9c. However the following factors should be considered, which may lead a designer to prefer a cascading structure for a particular application. First, the apparatus needs to be configured such that the sections maintain proper bit alignment prior to combining. The cascading structure includes delay elements to ensure such bit alignment. The same could be added if needed for the parallel structure that but that increases the complexity and cost of the structure. Second, if multiple low-bit devices prior to combining cannot be used, then scaling with a parallel structure can increase the bit width (see discussion for the example shown in FIG. 9d). To compensate for this, noise filtering and quantization within the NS loops can be configured to have a smaller resolution to compensate for this increase in bit-width in order to maintain the same output signal bit-width.

A cascading structure tends to have the advantages that it can be configured to avoid the bit-width increase added by scaling, so may be beneficial over a parallel structure which needs to process a signed signal, and the application is such that the multiple low-bit devices cannot be utilized in a parallel structure, as described with respect to the example shown in FIG. 9c. It should be appreciated that, as stated above, this increase in bit-width can be compensated by the appropriate configuration of the resolution for the NS loops. But if the application is sensitive to such changes in resolution a cascading structure may be preferred. However, a parallel structure may be preferred if latency is an issue, as the cascaded structure may increase latency. Further, the cascaded structure can have a higher hardware cost, for example due to the multiple combiners and delay elements. Also, the cascaded structure cannot easily accommodate multiple low-bit application devices.

Configuration block 1205 can also configure the signal reconstruction block, as needed to be consistent with the above.

It should be appreciated that although the examples discussed herein have all shown feedback loops, the principles can be extended for corresponding feed-forward implementations.

The methods and devices described herein are generally applicable to DACs and ADCs and other digital processing systems convert an input signal from one form into another, especially for high resolution data conversion of a signal which maintains the signal-to-noise ratio while reducing the resolution during signal processing. Accordingly, the methods and apparatus described herein can be used in digital amplifiers, wireless base-stations and terminals, audio and video equipment, optical systems, medical devices, sensors etc.

Through the descriptions of the preceding embodiments, the present invention may be implemented by using hardware only or by using software and a necessary universal hardware platform. Based on such understandings, the technical solution of the present invention may be embodied in the form of a software product. The software product may be stored in a non-volatile or non-transitory storage medium, which can be a compact disk read-only memory (CD-ROM), USB flash disk, or a removable hard disk. The software product includes a number of instructions that enable a processor to execute the methods provided in the embodiments of the present invention.

Although the present invention has been described with reference to specific features and embodiments thereof, it is evident that various modifications and combinations can be made thereto without departing from the invention. The specification and drawings are, accordingly, to be regarded simply as an illustration of the invention as defined by the appended claims, and are contemplated to cover any and all modifications, variations, combinations or equivalents that fall within the scope of the present invention.

The invention claimed is:

1. An apparatus for transforming an input signal comprising:
    a section calculation block which divides said input signal into a plurality of section signals;
    a section Noise Shaping (hereafter NS) block including at least one NS filter which applies at least one NS filter function to at least a subset of said plurality of section signals to produce corresponding noise shaped section signals; and
    a section reconstruction block which combines said corresponding noise shaped signals, and any remaining of said plurality of section signals, into an output signal;
    wherein said section NS block includes a plurality of NS filters, each configurable with a different Noise Weighting Function (hereafter "NWF") such that a different NWF can be applied to each of said subset of section signals.

2. The apparatus as claimed in claim 1 further comprising a section scaling block which applies a scaling factor to one or more of said plurality of section signals.

3. The apparatus as claimed in claim 2 wherein said section calculation block comprises an amplitude splitter which splits said input signal into said plurality of section signals based on amplitude.

4. The apparatus as claimed in claim 2 wherein said section calculation block comprises a bit-width splitter which splits said input signal into several lower-bit sections, with the sum of bit-widths of the sections equaling the bit-width of said input signal.

5. The apparatus as claimed in claim 2 wherein said section calculation block divides said signal such that one section includes Most Significant Bits (hereafter MSBs), and said one section is not part of said subset which undergoes NS, such that said section reconstruction block combines said one section and said subset of noise shaped signals to produce said output signal.

6. The apparatus as claimed in claim 2 wherein said apparatus has a parallel structure such that said plurality of signals are processed in parallel and wherein said section NS block includes a section NS loop for each of said subset of said plurality of section signals and wherein each of said section NS loops includes one of said NS filters.

7. The apparatus as claimed in claim 6, wherein said apparatus reduces an X-bit input signal into a Y-bit output signal, with Y<X, and wherein said apparatus splits said input signal into N sections, further comprising N low-bit application devices located between said NS block and said section reconstruction block, said N low-bit application devices operating on $A_1, A_2, \ldots A_N$ bits respectively, and wherein said output signal is used as if it is a Y-bit signal produced by a Y-bit application device, but for which $A_1+A_2+\ldots+A_N<Y$.

8. The apparatus as claimed in claim 2 wherein said apparatus has a cascading structure such that said section NS block and said section reconstruction block are combined into a series of cascading signal paths which includes a series of cascading section NS loops, combiners and delays elements.

9. The apparatus as claimed in claim 8 wherein said section calculation block divides said signal into three sections and wherein said series of cascading signal paths comprises:
    a first cascading signal path including a first section NS loop for applying a first NS function to said first section;
    a second cascading signal path including a delay element and combiner for combining a delayed second section signal with the output from said first section NS loop and further including a second section NS loop for applying a second NS function to the output of said combiner; and
    a third cascading signal path including a delay element and another combiner for combining a delayed third section signal with the output from said second section NS loop to produce said output signal.

10. The apparatus as claimed in claim 9 wherein said third cascading signal path further includes a third NS loop after said combiner to apply a third NS function to said combined signal to produce said output signal.

11. The apparatus as claimed in claim 1 further comprising a configuration block for configuring said apparatus depending on a configurable aspect.

12. The configurable apparatus as claimed in claim 11 wherein said section calculation block is configurable by said configuration block to divide said input signal into a plurality of section signals either based on amplitude or by bit width.

13. The configurable apparatus as claimed in claim 11, wherein said configuration block configures said section calculation block to perform the section calculation based on amplitude if said input signal requires a signed data format.

14. The configurable apparatus as claimed in claim 11, wherein said configuration block configures said NS block and said section reconstruction block to have a parallel structure, in which said plurality of section signals are processed in parallel and wherein said section NS block includes a section NS loop for each of said subset of said plurality of signals and wherein each of said section NS loops includes one of said NS filters.

15. The configurable apparatus as claimed in claim 11, wherein said configuration block configures said NS block and said section reconstruction block to have a cascading structure such that said section NS block and said section reconstruction block are combined into a series of cascading signal paths which includes a series of cascading section NS loops, combiners and delay elements.

16. The configurable apparatus as claimed in claim 15, wherein said configuration block configures said combiners as bit concatenators for signals sectioned based on bit-width and as adders for signals sectioned based on amplitude.

17. The configurable apparatus as claimed in claim 11 wherein said configuration block configures said NS block by configuring the NS filters to apply different NS to different sections by adjusting the number of taps and filter coefficients for each noise shaping filter.

18. The configurable apparatus as claimed in claim 11 wherein said configuration block configures the apparatus to have one of said sections, which include more significant bits than other sections, to bypass a noise shaping filter.

19. The configurable apparatus as claimed in claim 11 further comprising a section scaling block which applies a scaling factor to one or more of said plurality of section signals.

20. A method for transforming an input signal comprising:
dividing said input signal into a plurality of section signals;
applying at least one Noise Shaping (hereafter NS) filter function to at least a subset of said plurality of section signals to produce corresponding noise shaped section signals; and
combining said subset of noise shaped signals, and any remaining of said plurality of section signals into an output signal;
wherein applying comprises applying a different Noise Weighting Function to each of said subset of section signals.

21. The method as claimed in claim 20 further comprising applying a scaling factor to one or more of said plurality of section signals.

22. The method as claimed in claim 20 wherein said applying step utilizes a noise shaping filter for each of said subset of sections and wherein applying a different Noise Weighting Function to each of said subset of section signals comprises adjusting the number of taps and filter coefficients for each noise shaping filter.

23. The method as claimed in claim 22 wherein one of said sections, which include more significant bits than other sections, to bypass a noise shaping filter.

* * * * *